(12) United States Patent
Price et al.

(10) Patent No.: US 9,960,596 B2
(45) Date of Patent: May 1, 2018

(54) AUTOMATIC VOLTAGE SWITCHING CIRCUIT FOR SELECTING A HIGHER VOLTAGE OF MULTIPLE SUPPLY VOLTAGES TO PROVIDE AS AN OUTPUT VOLTAGE

(71) Applicant: QUALCOMM Incorporated, San Diego, CA (US)

(72) Inventors: Burt Lee Price, Apex, NC (US); Yeshwant Nagaraj Kolla, Wake Forest, NC (US); Neel Shashank Natekar, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 278 days.

(21) Appl. No.: 14/862,773

(22) Filed: Sep. 23, 2015

(65) Prior Publication Data
US 2016/0308355 A1 Oct. 20, 2016

Related U.S. Application Data

(60) Provisional application No. 62/147,722, filed on Apr. 15, 2015.

(51) Int. Cl.
*H02J 1/00* (2006.01)
*H02J 1/10* (2006.01)
(Continued)

(52) U.S. Cl.
CPC .............. *H02J 1/10* (2013.01); *H03K 5/2481* (2013.01); *H03K 19/00315* (2013.01); *H03K 19/0016* (2013.01)

(58) Field of Classification Search
USPC .................................................... 307/86, 80
See application file for complete search history.

(56) References Cited

U.S. PATENT DOCUMENTS 8,698,357 B2 4/2014 Ji
8,929,171 B2 1/2015 Park et al.
(Continued)

FOREIGN PATENT DOCUMENTS

EP 1047193 A1 10/2000

OTHER PUBLICATIONS

International Search Report and Written Opinion for PCT/US2016/021655, dated Sep. 30, 2016, 22 pages.
(Continued)

*Primary Examiner* — Rexford Barnie
*Assistant Examiner* — Dru Parries
(74) *Attorney, Agent, or Firm* — WT&T/Qualcomm

(57) ABSTRACT

Automatic voltage switching circuits for providing a higher voltage of multiple supply voltages are disclosed. In one aspect, an automatic voltage switching circuit is configured to generate a compare signal indicating which of a first supply voltage and a second supply voltage is a higher voltage. The automatic voltage switching circuit is further configured to generate first and second select signals based on the compare signal, wherein the first and second select signals are in a voltage domain of the higher voltage. Transistors corresponding to the first and second supply voltages control switching the output voltage to the higher voltage in response to the first and second select signals. Biasing the back-gates of the transistors using the output voltage reduces or avoids forward biasing in the body diodes of the transistors, thus reducing the possibility of the output voltage causing interference on a power supply corresponding to a non-activated transistor.

24 Claims, 7 Drawing Sheets

(51) Int. Cl.
*H03K 5/24* (2006.01)
*H03K 19/003* (2006.01)
*H03K 19/00* (2006.01)

(56) References Cited

U.S. PATENT DOCUMENTS

| | | |
|---|---|---|
| 9,001,572 B2 | 4/2015 | Choi et al. |
| 2002/0125934 A1 | 9/2002 | Wu et al. |
| 2008/0084195 A1 | 4/2008 | Frew et al. |
| 2011/0101946 A1 | 5/2011 | Nguyen |
| 2013/0313903 A1 | 11/2013 | Kayama |
| 2014/0001861 A1 | 1/2014 | Mann et al. |
| 2014/0285239 A1 | 9/2014 | Zanetta et al. |

OTHER PUBLICATIONS

Second Written Opinion for PCT/US2016/021655, dated Mar. 8, 2017, 15 pages.
Invitation to Pay Additional Fees and Partial Search Report for PCT/US2016/021655, dated Jun. 13, 2016, 7 pages.
International Preliminary Report on Patentability for PCT/US2016/021655, dated Jul. 19, 2017, 35 pages.

US 9,960,596 B2

AUTOMATIC VOLTAGE SWITCHING CIRCUIT FOR SELECTING A HIGHER VOLTAGE OF MULTIPLE SUPPLY VOLTAGES TO PROVIDE AS AN OUTPUT VOLTAGE

PRIORITY CLAIM

The present application claims priority under 35 U.S.C. § 119(e) to U.S. Provisional Patent Application Ser. No. 62/147,722 filed on Apr. 15, 2015 and entitled "AUTOMATIC VOLTAGE SWITCHING CIRCUITS FOR SELECTING AND PROVIDING A HIGHER VOLTAGE PARTICULARLY SUITED FOR BIASING TRANSISTOR BACK-GATES," the contents of which is incorporated herein by reference in its entirety.

BACKGROUND

I. Field of the Disclosure

The technology of the disclosure relates generally to providing power from a power source to an electrical component for powering their operation, and more particularly to voltage switching circuits for providing power from one or multiple power sources to electronic components for powering their operation.

II. Background

Circuits are increasingly being designed with multiple operating voltage domains ("voltage domains"). In this manner, circuit paths are provided which pass through the multiple voltage domains to provide different operating voltages to different components of a circuit. Employing multiple voltage domains in a circuit provides various benefits. For example, employing multiple voltage domains in a circuit allows a lower voltage domain to provide power to components that have relaxed minimum voltage levels for operation so as to conserve power. Providing multiple voltage domains also allows the lower voltage domain to be scaled-down to conserve power during a power conservation mode, or scaled-up to provide for increased performance (i.e., hyper-performance), without affecting the operation of the components in the higher voltage domain.

For example, a microprocessor-based system may include a logic power supply and a memory power supply. The logic power supply is used to provide power to logic blocks in a logic domain in the microprocessor-based system, while the memory power supply is used to provide power to memory arrays. Power switches may be provided to control coupling the respective logic blocks to the logic power supply, as well as to control coupling of the respective memory arrays to the memory power supply. Separate logic and memory power supplies are used to provide two separate voltage domains in the microprocessor-based system, because it may be desired to scale down (i.e., lower) and/or collapse the voltage of the logic power supply during lower power modes. Alternatively, it may be desired to scale up (i.e., increase) the voltage of the logic power supply during higher performance modes.

However, voltages provided by power supplies, such as the logic and memory power supplies described above, may fluctuate over time. For example, a supply voltage provided by the logic power supply may be higher than a supply voltage provided by the memory power supply at a particular point in time. Fluctuations in voltage levels can cause the supply voltage provided by the memory power supply to become higher than the supply voltage of the logic power supply. In this manner, such fluctuations may alter which supply voltage is the higher or lower voltage at any point in time.

SUMMARY OF THE DISCLOSURE

Aspects disclosed in the detailed description include an automatic voltage switching circuit for selecting a higher voltage of multiple supply voltages to provide as an output voltage. For example, certain applications may be designed to operate based on receiving an output voltage that is the higher voltage among multiple supply voltages even in light of the multiple supply voltages fluctuating over time. In this regard, in one example, an automatic voltage switching circuit is provided that is configured receive a first and second supply voltage as input voltages from respective power supplies. The automatic voltage switching circuit is configured to generate a compare signal indicating which of the first supply voltage and the second supply voltage is the higher voltage. The automatic voltage switching circuit then generates a select indicator indicative of whether the first or second supply voltage is the higher voltage. The select indicator controls activation of transistors sourced to the first and second supply voltages to selectively activate the transistor sourced to the higher voltage of the first or second supply voltages so as to provide the higher voltage as an output voltage. The select indicator is generated in the voltage domain of the higher voltage between the first and second supply voltages so that one of the transistors sourced to the first and second supply voltages is fully activated while the other is de-activated. Also, the back-gates of the transistors are back-gate biased to reduce or avoid forward biasing in the body diodes of the transistors so as to reduce or avoid interference of the output voltage by the non-activated transistor. Thus, the automatic voltage switching circuit can consistently provide the higher voltage of the first and second supply voltages as the output voltage even with voltage fluctuations of the first and second supply voltages, while reducing or avoiding interference caused by the higher voltage.

In this regard, in one aspect, an automatic voltage switching circuit is provided. The automatic voltage switching circuit comprises a voltage comparator circuit. The voltage comparator circuit is configured to generate a compare signal indicating which of a first supply voltage and a second supply voltage is a higher voltage. The automatic voltage switching circuit further comprises a voltage output circuit. The voltage output circuit comprises a voltage level shifter circuit configured to generate a first select signal and a second select signal based on the compare signal, wherein the first select signal and the second select signal are in a voltage domain of the higher voltage of the first supply voltage and the second supply voltage. The voltage output circuit further comprises a back-gate biased selector circuit. The back-gate biased selector circuit comprises a first transistor. The first transistor comprises a first node configured to receive the first supply voltage, a gate configured to receive the first select signal, a second node configured to provide an output voltage from the first node of the first transistor in response to the gate of the first transistor being activated by the first select signal, and a back-gate configured to receive the output voltage. The back-gate biased selector circuit further comprises a second transistor. The second transistor comprises a first node configured to receive the second supply voltage, a gate configured to receive the second select signal, a second node configured to provide the output voltage from the first node of the second transistor in response to the gate of the second transistor being activated by the second select signal, and a back-gate configured to receive the output voltage.

In another aspect, an automatic voltage switching circuit is provided. The automatic voltage switching circuit comprises a means for generating a compare signal indicating which of a first supply voltage and a second supply voltage is a higher voltage. The automatic voltage switching circuit further comprises a means for generating a first select signal and a second select signal based on the compare signal, wherein the first select signal and the second select signal are in a voltage domain of the higher voltage of the first supply voltage and the second supply voltage. The automatic voltage switching circuit further comprises a means for providing the higher voltage of the first supply voltage and the second supply voltage as an output voltage, comprising a first transistor. The first transistor comprises a first node configured to receive the first supply voltage, a gate configured to receive the first select signal, a second node configured to provide the output voltage from the first node of the first transistor in response to the gate of the first transistor being activated by the first select signal, and a back-gate configured to receive the output voltage. The means for providing the higher voltage of the first supply voltage and the second supply voltage as the output voltage further comprises a second transistor. The second transistor comprises a first node configured to receive the second supply voltage, a gate configured to receive the second select signal, a second node configured to provide the output voltage from the first node of the second transistor in response to the gate of the second transistor being activated by the second select signal, and a back-gate configured to receive the output voltage.

In another aspect, a method for automatically selecting a higher supply voltage is provided. The method comprises generating a compare signal indicating which of a first supply voltage and a second supply voltage is a higher voltage. The method further comprises generating a first select signal and a second select signal based on the compare signal, wherein the first select signal and the second select signal are in a voltage domain of the higher voltage of the first supply voltage and the second supply voltage. The method further comprises providing, by a back-gate biased selector circuit, the higher voltage of the first supply voltage and the second supply voltage as an output voltage in response to the first select signal and the second select signal, wherein the output voltage is used to bias back-gates of a first transistor and a second transistor of the back-gate biased selector circuit.

In another aspect, a power switch system is provided. The power switch system comprises a power switch circuit. The power switch circuit comprises a first transistor. The first transistor comprises a gate configured to receive a first enable signal, a source configured to receive a first supply voltage, and a drain coupled to a powered circuit. The power switch circuit further comprises a second transistor. The second transistor comprises a gate configured to receive a second enable signal, a source configured to receive a second supply voltage, and a drain coupled to the powered circuit. The power switch system further comprises an automatic voltage switching circuit. The automatic voltage switching circuit comprises a voltage comparator circuit. The voltage comparator circuit is configured to generate a compare signal indicating which of the first supply voltage and the second supply voltage is a higher voltage. The automatic voltage switching circuit further comprises a voltage output circuit. The voltage output circuit comprises a voltage level shifter circuit. The voltage level shifter circuit is configured to generate a first select signal and a second select signal based on the compare signal, wherein the first select signal and the second select signal are in a voltage domain of the higher voltage of the first supply voltage and the second supply voltage. The voltage output circuit further comprises a back-gate biased selector circuit. The back-gate biased selector circuit comprises a first transistor. The first transistor comprises a first node configured to receive the first supply voltage, a gate configured to receive the first select signal, a second node configured to provide an output voltage from the first node of the first transistor in response to the gate of the first transistor being activated by the first select signal, and a back-gate configured to receive the output voltage. The back-gate biased selector circuit further comprises a second transistor. The second transistor comprises a first node configured to receive the second supply voltage, a gate configured to receive the second select signal, a second node configured to provide the output voltage from the first node of the second transistor in response to the gate of the second transistor being activated by the second select signal, and a back-gate configured to receive the output voltage.

DETAILED DESCRIPTION

Figure 1:
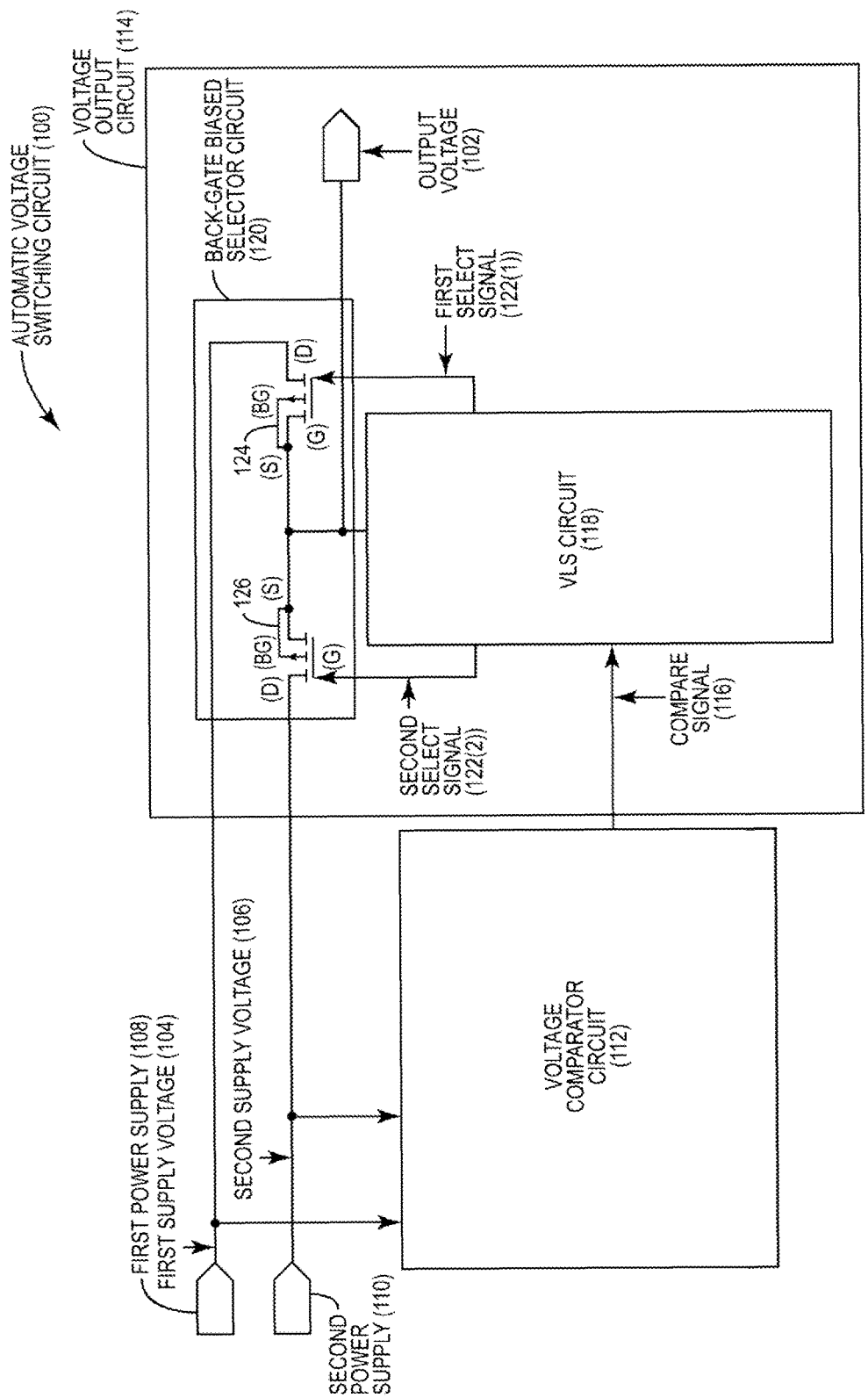
FIG. 1 is a block diagram of an exemplary automatic voltage switching circuit configured to provide a higher voltage of a first and a second supply voltage as an output voltage.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

FIG. 1 illustrates an exemplary automatic voltage switching circuit 100 that is configured to provide an output voltage 102 that is a higher voltage between a first supply voltage 104 and a second supply voltage 106. In this example, the first supply voltage 104 is provided by a first power supply 108, while the second supply voltage 106 is provided by a second power supply 110. The automatic voltage switching circuit 100 includes a voltage comparator circuit 112 and a voltage output circuit 114. The voltage comparator circuit 112 is configured to generate a compare signal 116 indicating which of the first supply voltage 104 and the second supply voltage 106 is the higher voltage. Further, the voltage output circuit 114 includes a voltage level shifter (VLS) circuit 118 and a back-gate biased selector circuit 120. The VLS circuit 118 is configured to generate a first select signal 122(1) and a second select signal 122(2) based on the compare signal 116. Notably, the VLS circuit 118 is driven by the output voltage 102 provided by the back-gate biased selector circuit 120. Thus, the first and second select signals 122(1), 122(2) generated by the VLS circuit 118 are generated in a voltage domain of the output voltage 102, wherein the voltage domain of the output voltage 102 is equivalent to the voltage domain of the higher voltage of the first and second supply voltages 104, 106.

With continuing reference to FIG. 1, the back-gate biased selector circuit 120 includes a first transistor 124 and a second transistor 126. The first transistor 124 includes a gate (G) configured to receive the first select signal 122(1), a first node (D) configured to receive the first supply voltage 104, a second node (S) configured to provide the output voltage 102 from the first node (D) of the first transistor 124 in response to the gate (G) of the first transistor 124 being activated by the first select signal 122(1), and a back-gate (BG) configured to receive the output voltage 102. Thus, the first transistor 124 is configured to provide the first supply voltage 104 as the output voltage 102 in response to the first select signal 122(1) indicating that the first supply voltage 104 is higher than the second supply voltage 106. Further, the second transistor 126 includes a gate (G) configured to receive the second select signal 122(2), a first node (D) configured to receive the second supply voltage 106, a second node (S) configured to provide the output voltage 102 from the first node (D) of the second transistor 126 in response to the gate (G) of the second transistor 126 being activated by the second select signal 122(2), and a back-gate (BG) configured to receive the output voltage 102. Thus, the second transistor 126 is configured to provide the second supply voltage 106 as the output voltage 102 in response to the second select signal 122(2) indicating that the second supply voltage 106 is higher than the first supply voltage 104. Notably, generating the first and second select signals 122(1), 122(2) in the voltage domain of the higher voltage helps to ensure that one of the first and second transistors 124, 126 is fully activated while one of the first and second transistors 124, 126 is fully de-activated.

With continuing reference to FIG. 1, the back-gates (BGs) of the first and second transistors 124, 126 are biased by the output voltage 102. Because the output voltage 102 is the higher voltage of the first and second supply voltages 104, 106, biasing the back-gates (BGs) of the first and second transistors 124, 126 using the output voltage 102 reduces or avoids forward biasing in body diodes (not shown) of the first and second transistors 124, 126. Reducing or avoiding forward biasing in the body diodes of the first and second transistors 124, 126 reduces the possibility of the higher voltage causing interference in a power supply of the lower voltage. As a non-limiting example, if the first supply voltage 104 is higher than the second supply voltage 106, biasing the back-gates (BGs) of the first and second transistors 124, 126 reverse biases the body diode of the second transistor 126 such that the output voltage 102 (e.g., the first supply voltage 104) does not traverse the second transistor 126 and interfere with the second power supply 110. Similarly, if the second supply voltage 106 is higher than the first supply voltage 104, biasing the back-gates (BGs) of the first and second transistors 124, 126 reverse biases the body diode of the first transistor 124 such that the output voltage 102 (e.g., the second supply voltage 106) does not traverse the first transistor 124 and interfere with the first power supply 108. Thus, the automatic voltage switching circuit 100 may consistently provide the higher voltage as the output voltage 102 in light of voltage fluctuations, while mitigating interference caused by the higher voltage.

Notably, elements of the automatic voltage switching circuit 100 described above may also be referred to herein as means for performing particular functions. In this manner, the voltage comparator circuit 112 is sometimes referred to herein as a means for generating the compare signal 116 indicating which of the first supply voltage 104 and the second supply voltage 106 is the higher voltage. Further, the VLS circuit 118 is sometimes referred to herein as a means for generating the first select signal 122(1) and the second select signal 122(2) based on the compare signal 116. As discussed above, the first and second select signals 122(1), 122(2) are in the voltage domain of the higher voltage of the first and second supply voltages 104, 106. The back-gate biased selector circuit 120 is sometimes referred to herein as a means for providing the higher voltage of the first and second supply voltages 104, 106.

Figure 2:
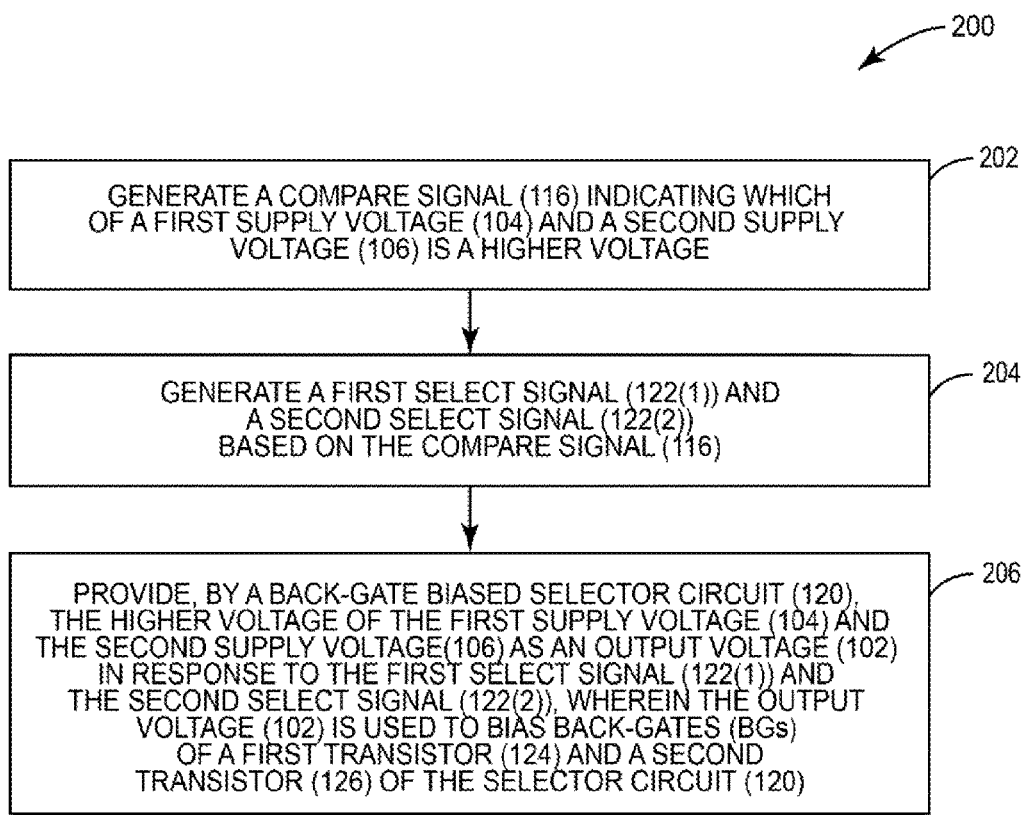
FIG. 2 is a flowchart illustrating an exemplary process employed by the automatic voltage switching circuit in FIG. 1 to provide the higher voltage of the first and a second supply voltage as the output voltage.

In this regard, FIG. 2 illustrates an exemplary process 200 that may be employed by the automatic voltage switching circuit 100 in FIG. 1 to provide the output voltage 102. The process 200 includes generating the compare signal 116 indicating which of the first supply voltage 104 and the second supply voltage 106 is the higher voltage (block 202). Further, the process 200 includes generating the first select signal 122(1) and the second select signal 122(2) based on the compare signal 116 (block 204). Notably, the first and second select signals 122(1), 122(2) are in the voltage domain of the higher voltage of the first and second supply voltages 104, 106. The process 200 also includes providing, by the back-gate biased selector circuit 120, the higher voltage of the first supply voltage 104 and the second supply voltage 106 as the output voltage 102 in response to the first and second select signals 122(1), 122(2) (block 206). Notably, the output voltage 102 provided in block 206 is used to bias the back-gates (BGs) of the first transistor 124 and the second transistor 126 of the back-gate biased selector circuit 120. Thus, by employing the process 200, the automatic voltage switching circuit 100 in FIG. 1 may consistently provide the higher voltage as the output voltage 102 in light of voltage fluctuations, while mitigating interference caused by the higher voltage.

Figure 3:
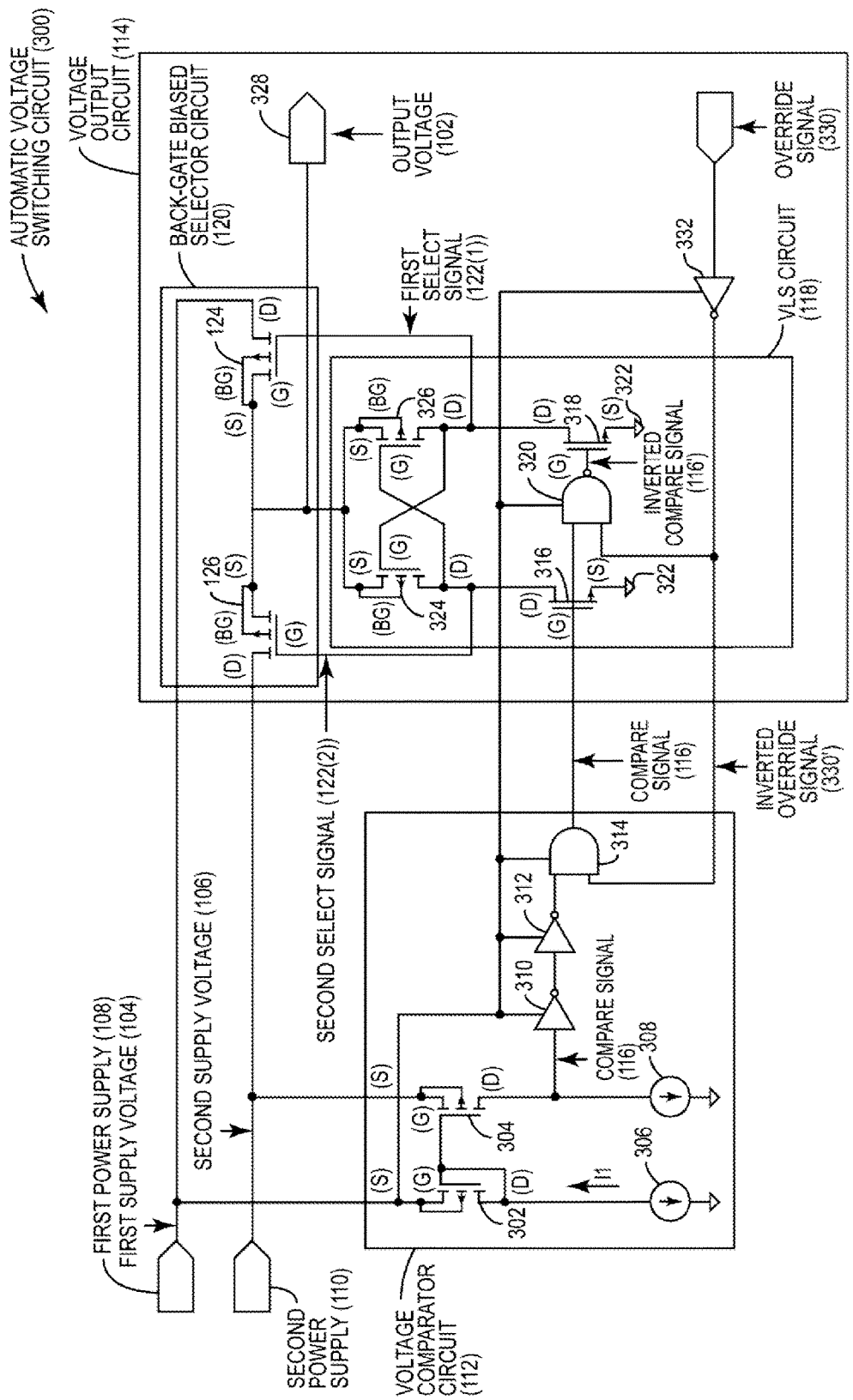
FIG. 3 is an exemplary circuit diagram of the automatic voltage switching circuit in FIG. 1.

In this regard, FIG. 3 illustrates a circuit diagram of an exemplary automatic voltage switching circuit 300. The automatic voltage switching circuit 300 includes certain components in common with the automatic voltage switching circuit 100 in FIG. 1, which are shown with common element numbers between FIGS. 1 and 3, and thus, will not be re-described herein. In this example, the voltage comparator circuit 112 is a differential voltage comparator and includes a first p-type metal-oxide semiconductor (PMOS) transistor 302 and a second PMOS transistor 304. A source (S) of the first PMOS transistor 302 is configured to receive the first supply voltage 104, and a source (S) of the second PMOS transistor 304 is configured to receive the second supply voltage 106. Further, a drain (D) of the first PMOS transistor 302 is electrically coupled to a first current source 306. A gate (G) of the first PMOS transistor 302 is electrically coupled to the drain (D) of the first PMOS transistor 302 so as to receive a first drive current (I1) from the first current source 306. Further, a gate (G) of the second PMOS transistor 304 is coupled to the gate (G) of the first PMOS transistor 302 so as to receive the first drive current (ID). A drain (D) of the second PMOS transistor 304 is electrically coupled to a second current source 308 and configured to provide the compare signal 116. In this example, the first and second current sources 306, 308 are powered by a bias generator (not shown) that is powered by the first supply voltage 104. Further, the voltage comparator circuit 112 employs inverters 310, 312 and an AND-based gate 314 (e.g., an AND gate 314) to drive the compare signal 116 to the VLS circuit 118.

With continuing reference to FIG. 3, the VLS circuit 118 employs a first n-type MOS (NMOS) transistor 316 with a gate (G) configured to receive the compare signal 116, and a second NMOS transistor 318 with a gate (G) configured to receive an inverted compare signal 116' from an AND-based gate 320 (e.g., a NAND gate 320). Sources (S) of the first and second NMOS transistors 316, 318 are electrically coupled to a ground voltage source 322. Further, a drain (D) of the first NMOS transistor 316 is electrically coupled to a drain (D) of a first PMOS transistor 324 and a gate (G) of a second PMOS transistor 326 in the VLS circuit 118. A drain (D) of the second NMOS transistor 318 is electrically coupled to a drain (D) of the second PMOS transistor 326 and a gate (G) of the first PMOS transistor 324. Sources (S) of the first and second PMOS transistors 324, 326 are configured to receive the output voltage 102 from the back-gate biased selector circuit 120. Notably, the source (S) of the first PMOS transistor 324 is electrically coupled to a back-gate (BG) of the first PMOS transistor 324, while a source (S) of the second PMOS transistor 326 is electrically coupled to a back-gate (BG) of the second PMOS transistor 326. In this manner, the back-gates (BG) of the first and second PMOS transistors 324, 326 are biased by the output voltage 102, which reverse-biases body diodes (not shown) of the first and second PMOS transistors 324, 326. Similar to description of interference above, reverse-biasing the body diodes of the first and second PMOS transistors 324, 326 reduces or avoids interference with the output voltage 102 by whichever of the first and second PMOS transistors 324, 326 is not activated.

With continuing reference to FIG. 3, the drain (D) of the first NMOS transistor 316 provides the second select signal 122(2), while the drain (D) of the second NMOS transistor 318 provides the first select signal 122(1). The second select signal 122(2) is provided to the gate (G) of the second transistor 126, while the first select signal 122(1) is provided to the gate (G) of the first transistor 124 in the back-gate biased selector circuit 120. In this example, the first and second transistors 124, 126 are PMOS transistors (i.e., the first and second PMOS transistors 124, 126). A drain (D) (i.e., the first node (D)) of the second PMOS transistor 126 is configured to receive the second supply voltage 106 from the second power supply 110. Further, a drain (D) (i.e., the first node (D)) of the first PMOS transistor 124 is configured to receive the first supply voltage 104 from the first power supply 108. Sources (S) (e.g., second nodes (S)) of the first and second PMOS transistors 124, 126 are configured to provide the output voltage 102 from the respective drains (D) to a voltage output 328. As described in more detail below, in this example, an override signal 330 is also provided that may be used to force the output voltage 102 to approximately equal the first supply voltage 104 using an inverter 332 in conjunction with the AND gate 314 and the NAND gate 320.

With continuing reference to FIG. 3, a non-limiting example is now described. In this manner, if the first supply voltage 104 is higher than the second supply voltage 106, a gate-source voltage of the first PMOS transistor 302 is less than a gate-source voltage of the second PMOS transistor 304. Thus, the drain (D) of the second PMOS transistor 304 will be pulled to ground, causing the compare signal 116 to have a logic low '0' voltage. If the override signal 330 has a logic low '0' voltage, thus disabling the override feature, the compare signal 116 provided by the voltage comparator circuit 112 has a logic low '0' voltage. Thus, the inverted compare signal 116' provided by the NAND gate 320 has a logic high '1' voltage, which activates the second NMOS transistor 318. Activation of the second NMOS transistor 318 causes the first select signal 122(1) provided by the drain (D) of the second NMOS transistor 318 to have a logic low '0' voltage, thus activating the first PMOS transistor 324 of the VLS circuit 118 and the first PMOS transistor 124 of the back-gate biased selector circuit 120. Activation of the first PMOS transistor 124 of the back-gate biased selector circuit 120 causes the output voltage 102 to be driven to the first supply voltage 104. Further, activation of the first PMOS transistor 324 of the VLS circuit 118 allows the output voltage 102 to be provided to the gates (G) of the second PMOS transistors 126, 326, which deactivates the second PMOS transistors 126, 326 and prevents the second supply voltage 106 from interfering with the output voltage 102.

Conversely, if the second supply voltage 106 is higher than the first supply voltage 104, the gate-source voltage of the second PMOS transistor 304 is less than the gate-source voltage of the first PMOS transistor 302. Thus, the drain (D) of the second PMOS transistor 304 will not be pulled to ground, causing the compare signal 116 to have a logic high '1' voltage. If the override signal 330 has a logic low '0' voltage, thus disabling the override feature, the compare signal 116 provided by the voltage comparator circuit 112 has a logic high '1' voltage, thus activating the first NMOS transistor 316. Activation of the first NMOS transistor 316 causes the second select signal 122(2) provided by the drain (D) of the first NMOS transistor 316 to have a logic low '0' voltage, thus activating the second PMOS transistor 326 of the VLS circuit 118 and the second PMOS transistor 126 of the back-gate biased selector circuit 120. Activation of the second PMOS transistor 126 of the back-gate biased selector circuit 120 causes the output voltage 102 to be driven to the second supply voltage 106. Further, activation of the second PMOS transistor 326 of the VLS circuit 118 allows the output voltage 102 to be provided to the gates (G) of the first PMOS transistors 124, 324, which deactivates the first PMOS transistors 124, 324 and prevents the first supply voltage 104 from interfering with the output voltage 102.

With continuing reference to FIG. 3, as noted above, the override signal 330 may be used to force the output voltage 102 to approximately equal the first supply voltage 104. In this manner, whether the first supply voltage 104 or the second supply voltage 106 is the higher voltage, if the override signal 330 has a high logic '1' voltage, the output voltage 102 is driven to the first supply voltage 104. For example, if the override signal 330 has a logic high '1' voltage, an inverted override signal 330' is provided from the inverter 332 to the AND gate 314 in the voltage comparator circuit 112. If an input of the AND gate 314 corresponding to the inverted override signal 330' has a logic low '0' voltage, the AND gate 314 generates the compare signal 116 with a logic low '0' voltage. As described above, when the compare signal 116 has logic low '0' voltage, the second NMOS transistor 318 in the VLS circuit 118 is activated, thus causing the first select signal 122(1) to have a logic low '0' voltage. Therefore, a logic low '0' voltage of the first select signal 122(1) activates the first PMOS transistor 124 in the back-gate biased selector circuit 120, which causes the output voltage 102 to approximately equal the first supply voltage 104.

Figure 4:
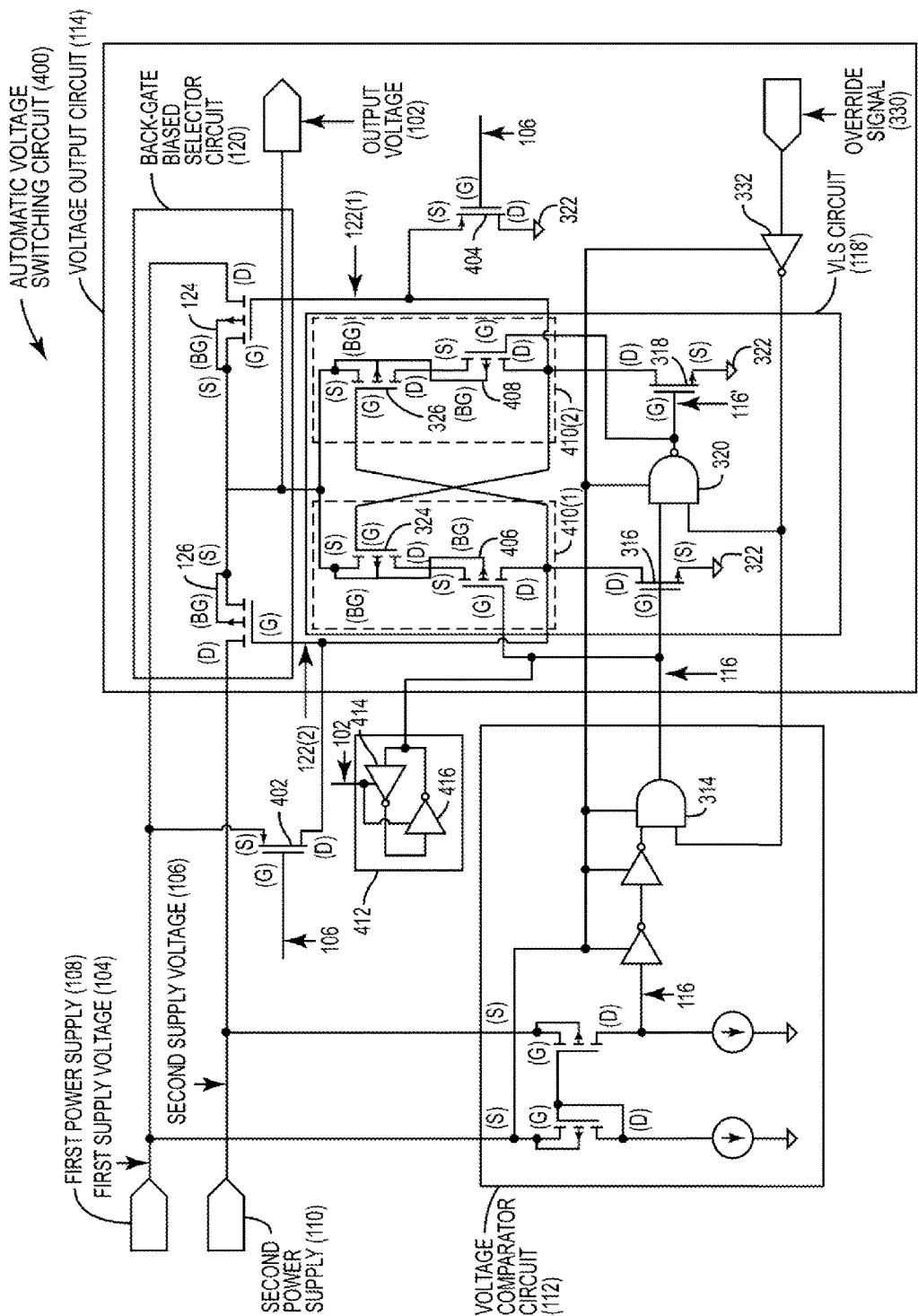
FIG. 4 is a circuit diagram of another exemplary automatic voltage switching circuit configured to provide a higher voltage of a first and a second supply voltage as an output voltage.

In addition to the override feature achieved using the override signal 330 in FIG. 3, a default voltage mode may also be employed such that the output voltage 102 is driven to the first supply voltage 104 by default in response to certain system conditions. In this regard, FIG. 4 illustrates a circuit diagram of an exemplary automatic voltage switching circuit 400. The automatic voltage switching circuit 400 includes certain components in common with the automatic voltage switching circuits 100, 300 in FIGS. 1, 3, which are shown with common element numbers between FIGS. 1, 3, and 4, and thus, will not be re-described herein. In this example, the automatic voltage switching circuit 400 is configured to provide the output voltage 102 approximately equal to the first supply voltage 104 in response to the second supply voltage 106 having a level below a low threshold. As non-limiting examples, the second supply voltage 106 may be below the low threshold during system start-up or in response to the second power supply 110 crashing. In this example, the automatic voltage switching circuit 400 includes a first PMOS transistor 402 and a second PMOS transistor 404. The first PMOS transistor 402 includes a gate (G) configured to receive the second supply voltage 106, a source (S) configured to receive the first supply voltage 104, and a drain (D) electrically coupled to the gates (G) of the second PMOS transistor 126 in the back-gate biased selector circuit 120 and the second PMOS transistor 326 in a VLS circuit 118'. The second PMOS transistor 404 includes a gate (G) configured to receive the second supply voltage 106, a drain (D) electrically coupled to the ground voltage source 322, and a source (S) electrically coupled to the gates (G) of the first PMOS transistor 124 in the back-gate biased selector circuit 120 and the first PMOS transistor 324 in the VLS circuit 118'.

With continuing reference to FIG. 4, as a non-limiting example, if the second power supply 110 fails such that the second supply voltage 106 is unavailable, the first and second PMOS transistors 402, 404 are activated. Activation of the first PMOS transistor 402 causes the first supply voltage 104 to be provided to the gate (G) of the second PMOS transistor 126 in the back-gate biased selector circuit 120, which prevents the output voltage 102 from being driven to the second supply voltage 106. Further, activation of the second PMOS transistor 404 causes a ground voltage (e.g., 0 V) to be provided to the gate (G) of the first PMOS transistor 124 in the back-gate biased selector circuit 120, which causes the output voltage 102 to be driven to the first supply voltage 104.

Notably, with continuing reference to FIG. 4, the VLS circuit 118' in the automatic voltage switching circuit 400 includes third and fourth PMOS transistors 406, 408 that are not employed in the VLS circuit 118 in the automatic voltage switching circuit 300 in FIG. 3. The third PMOS transistor 406 includes a source (S) electrically coupled to the drain (D) of the first PMOS transistor 324, a gate (G) configured to receive the compare signal 116, a back-gate (BG) configured to receive the output voltage 102, and a drain (D) electrically coupled to the drain (D) of the first NMOS transistor 316. The fourth PMOS transistor 408 includes a source (S) electrically coupled to the drain (D) of the second PMOS transistor 326, a gate (G) configured to receive the inverted compare signal 116', a back-gate configured to receive the output voltage 102, and a drain (D) electrically coupled to the drain (D) of the second NMOS transistor 318. The third and fourth PMOS transistors 406, 408 are included such that the first and second PMOS transistors 324, 326 in the VLS circuit 118' may be designed with a shorter channel length, and thus, a smaller area while still allowing the VLS circuit 118' to provide the first and second select signals 122(1), 122(2) in response to the compare signal 116. For example, in voltage level shifter circuits generally, pull-up PMOS transistors may be designed with weaker activation strengths to avoid being concurrently activated with corresponding pull-down NMOS transistors. However, including the third and fourth PMOS transistors 406, 408 effectively weakens a PMOS transistor stack 410(1), which includes the PMOS transistors 324, 406, and a PMOS transistor stack 410(2), which includes the PMOS transistors 326, 408, by raising the effective drain-to-source resistance of each PMOS transistor stack 410(1), 410(2). Notably, such weakening of the above-described PMOS transistor stacks 410(1), 410(2) is achieved without separately weakening the first and second PMOS transistors 324, 326. Thus, the third and fourth PMOS transistors 406, 408 may allow the first and second NMOS transistors 316, 318 to be activated in response to the compare signal 116 and the inverted compare signal 116' without weakening the first and second PMOS transistors 324, 326 through increased area.

Further, with continuing reference to FIG. 4, a keeper circuit 412 that includes cross-coupled inverters 414, 416 is included in the automatic voltage switching circuit 400. Notably, the cross-coupled inverters 414, 416 are powered by the output voltage 102. The keeper circuit 412 is configured to maintain the voltage on the first and second select signals 122(1), 122(2) to help the VLS circuit 118' to achieve increased performance, as the first and second NMOS transistors 316, 318 and the third and fourth PMOS transistors 406, 408 may operate more quickly if the first and second select signals 122(1), 122(2) each holds its voltage. Further, the keeper circuit 412 also helps to maintain the voltage on the first and second select signals 122(1), 122(2) such that the output voltage 102 is driven to the first supply voltage 104 if the second supply voltage 106 is unavailable, as described in the previous example.

Figure 5:
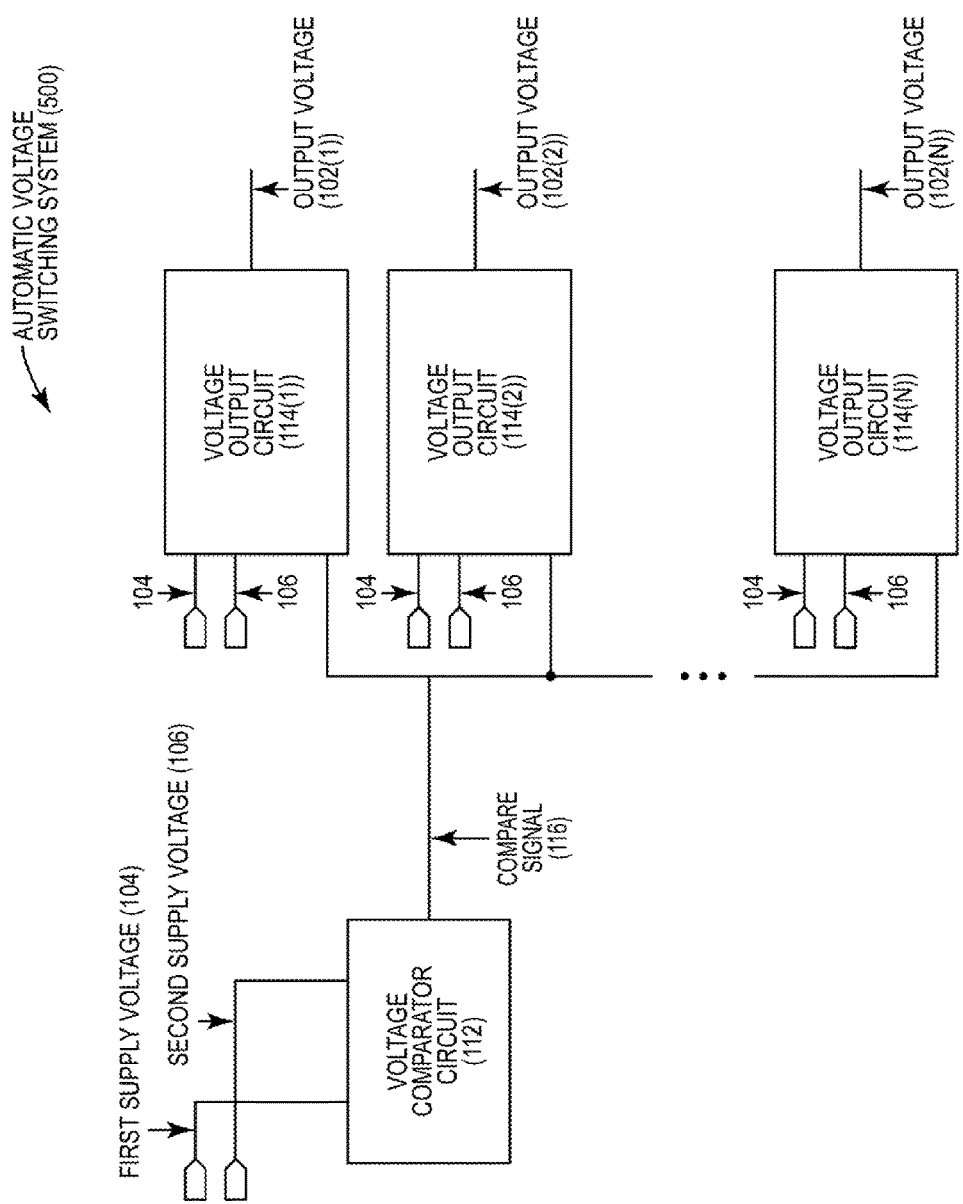
FIG. 5 is a block diagram of an exemplary automatic voltage switching system employing one voltage comparator circuit configured to provide a compare signal to multiple voltage output circuits.

Further, multiple instances of the voltage output circuit 114 in FIG. 1 may be employed with a single instance of the voltage comparator circuit 112 in FIG. 1 so as to provide the output voltage 102 to multiple circuits within a system. In this regard, FIG. 5 illustrates an automatic voltage switching system 500 employing the voltage comparator circuit 112 with multiple voltage output circuits 114(1)-114(N). In this manner, the voltage comparator circuit 112 is configured to generate the compare signal 116 based on the first supply voltage 104 and the second supply voltage 106. Further, each voltage output circuit 114(1)-114(N) is configured to receive the compare signal 116 and generate a corresponding output voltage 102(1)-102(N). In this manner, each output voltage 102 is approximately equal to the higher voltage of the first supply voltage 104 and the second supply voltage 106.

Figure 6:
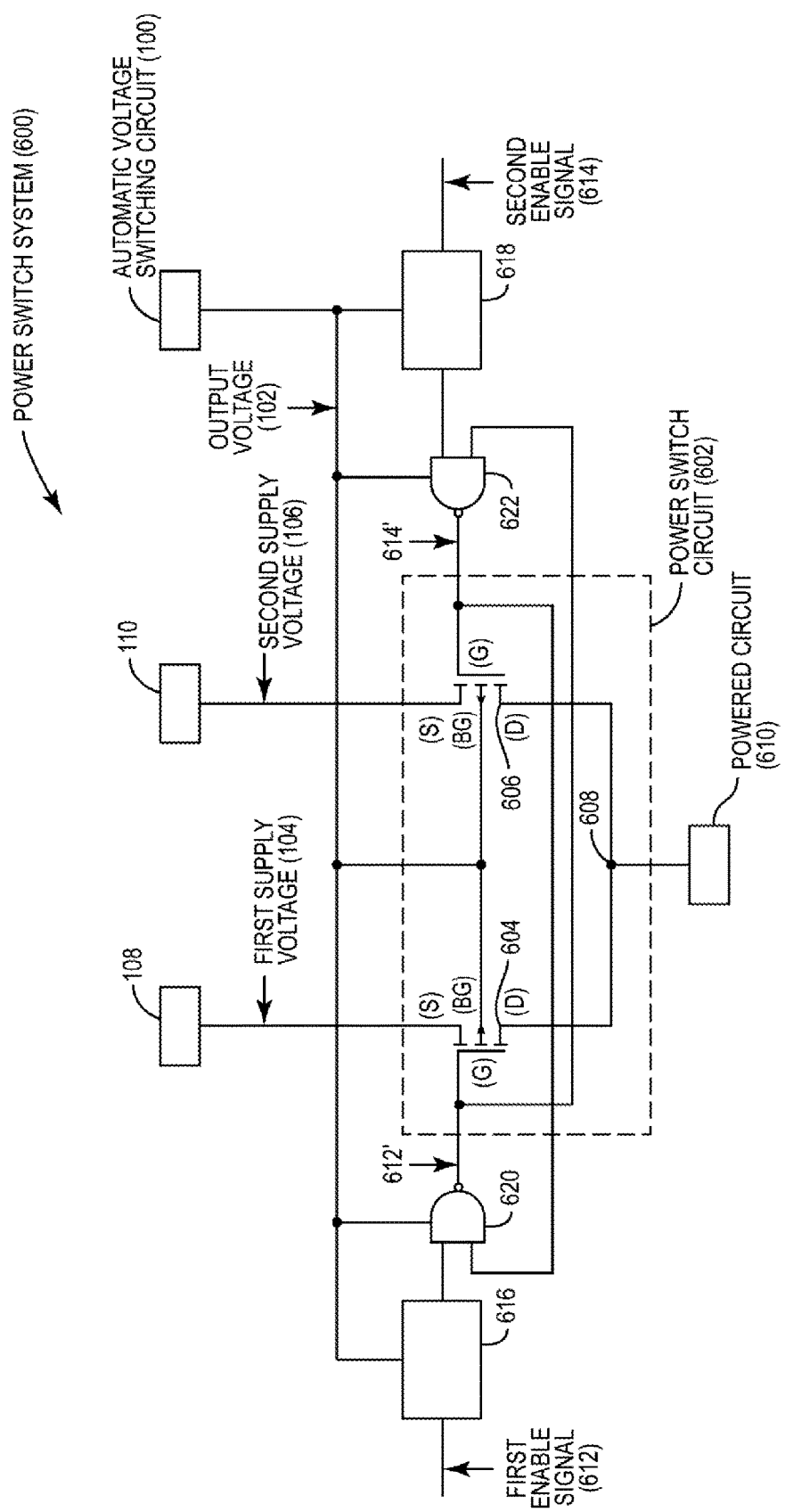
FIG. 6 is a block diagram of a power switch system employing an automatic voltage switching circuit to back-bias transistors of a power switch circuit.

Additionally, the output voltage 102 of the automatic voltage switching circuit 100 in FIG. 1 may be used in multiple applications. As a non-limiting example, FIG. 6 illustrates an exemplary power switch system 600 that may use the output voltage 102 of the automatic voltage switching circuit 100. In this manner, the power switch system 600 includes a power switch circuit 602 employing first and second PMOS transistors 604, 606. Notably, back-gates of the first and second PMOS transistors 604, 606 are biased by the output voltage 102 of the automatic voltage switching circuit 100. A source (S) of the first PMOS transistor 604 is configured to receive the first supply voltage 104, while a source (S) of the second PMOS transistor 606 is configured to receive the second supply voltage 106. Additionally, drains (D) of the first and second PMOS transistors 604, 606 are electrically coupled to a power node 608 coupled to a powered circuit 610. Thus, the first PMOS transistor 604 is configured to provide the first supply voltage 104 to the power node 608 in response to a first enable signal 612 provided to a gate (G) of the first PMOS transistor 604. The second PMOS transistor 606 is configured to provide the second supply voltage 106 to the power node 608 in response to a second enable signal 614 provided to the gate (G) of the second PMOS transistor 606.

With continuing reference to FIG. 6, voltage level shifters 616, 618 and AND-based gates 620, 622 (e.g., NAND gates 620, 622) are included to ensure that only one of the first and second PMOS transistors 604, 606 is activated at a time by generating conditioned first and second enable signals 612', 614', respectively. Notably, the voltage level shifters 616, 618 are employed so that the first and second enable signals 612, 614 are provided to the NAND gates 620, 622 in a voltage domain of the output voltage 102. In other words, the voltage level shifters 616, 618 are driven by the output voltage 102 from the automatic voltage switching circuit 100. Thus, the voltage level shifters 616, 618 operate in the voltage domain of the output voltage 102, wherein the voltage domain of the output voltage 102 is equivalent to the voltage domain of the higher voltage of the first and second supply voltages 104, 106. Because the voltage level shifters 616, 618 are driven by the output voltage 102 in this manner, the voltage level shifters 616, 618 shift the first and second enable signals 612, 614, respectively, into the voltage domain of the output voltage 102. Further, back-gates (BG) of the first and second PMOS transistors 604, 606 are configured to receive to the output voltage 102 provided by the automatic voltage switching circuit 100. Because the output voltage 102 is the higher voltage of the first and second supply voltages 104, 106, the output voltage 102 may be used to achieve reverse biasing of body diodes (not shown) in the first and second PMOS transistors 604, 606. Reverse biasing the body diodes in the first and second PMOS transistors 604, 606 reduces the possibility of the higher voltage causing interference in a power supply of the lower voltage, as previously described.

The automatic voltage switching circuits for providing a higher voltage of multiple supply voltages as an output voltage according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
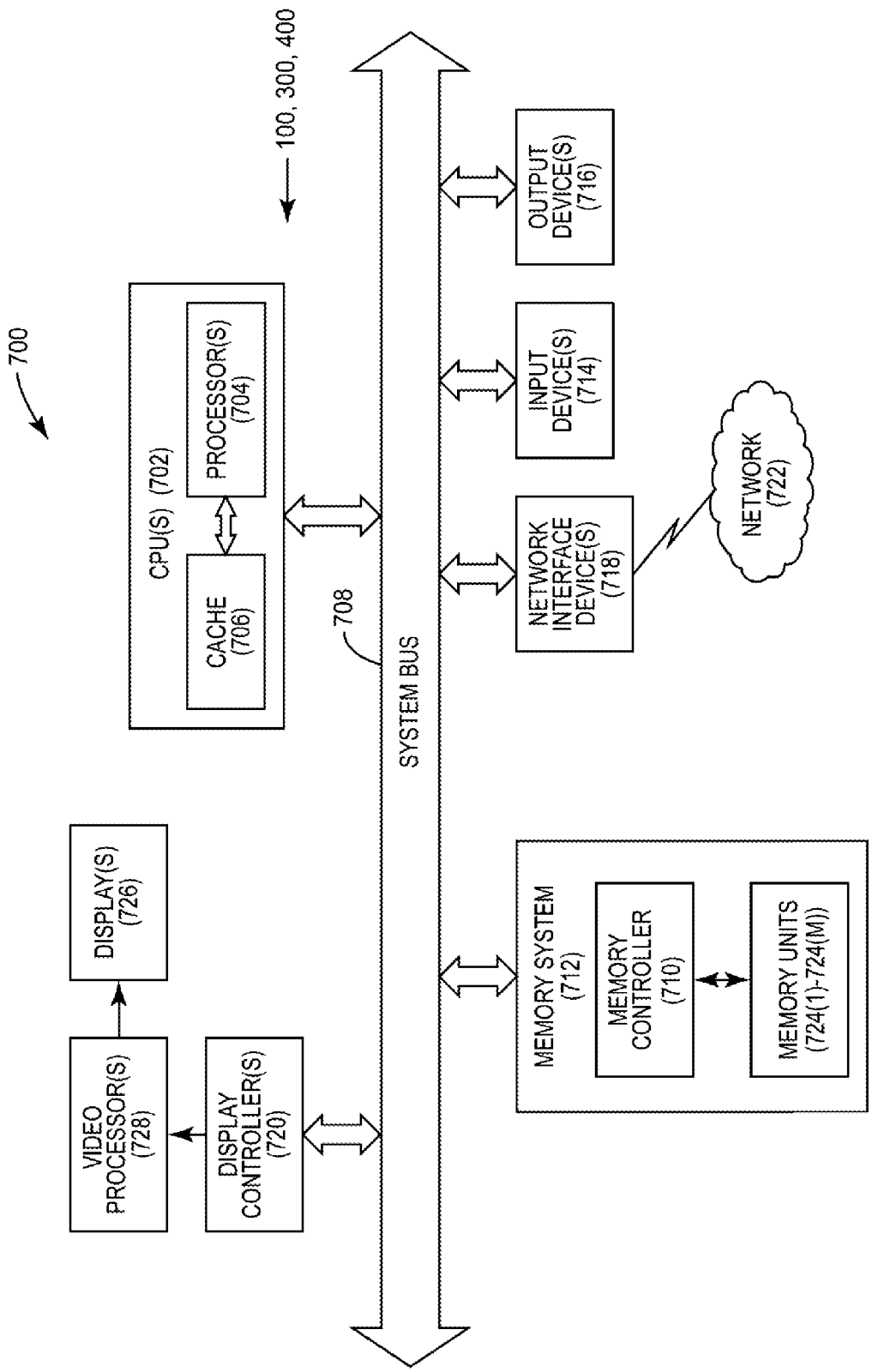
FIG. 7 is a block diagram of an exemplary processor-based system that can include the automatic voltage switching circuits of FIGS. 1, 3, and 4.

In this regard, FIG. 7 illustrates an example of a processor-based system 700. Notably, any element described herein in relation to the processor-based system 700 can include the automatic voltage switching circuits 100, 300, or 400 illustrated in FIGS. 1, 3, and 4, respectively. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including but not limited to input keys, switches, voice processors, etc. The output device(s) 716 can include any type of output device, including but not limited to audio, video, other visual indicators, etc. The network interface device(s) 718 can be any device configured to allow exchange of data to and from a network 722. The network 722 can be any type of network, including but not limited to a wired or wireless network, a private or public network, a local area network (LAN), a wireless local area network (WLAN), a wide area network (WAN), a BLUETOOTH™ network, or the Internet. The network interface device(s) 718 can be configured to support any type of communications protocol desired. The memory system 712 can include one or more memory units 724(1)-724(M).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An automatic voltage switching circuit, comprising:
   a voltage comparator circuit configured to generate a compare signal indicating which of a first supply voltage and a second supply voltage is a higher voltage;
   a voltage output circuit, comprising:
      a voltage level shifter circuit configured to generate:
         a first select signal based on the compare signal indicating the first supply voltage is the higher voltage of the first supply voltage and the second supply voltage, wherein the first select signal is in a voltage domain of the higher voltage; and
         a second select signal based on the compare signal indicating the second supply voltage is the higher voltage of the first supply voltage and the second supply voltage, wherein the second select signal is in the voltage domain of the higher voltage; and
      a back-gate biased selector circuit, comprising:
         a first transistor, comprising a first node configured to receive the first supply voltage, a gate configured to receive the first select signal, a second node configured to provide an output voltage from the first node of the first transistor in response to the gate of the first transistor being activated by the first select signal, and a back-gate configured to receive the output voltage; and
         a second transistor, comprising a first node configured to receive the second supply voltage, a gate configured to receive the second select signal, a second node configured to provide the output voltage from the first node of the second transistor in response to the gate of the second transistor being activated by the second select signal, and a back-gate configured to receive the output voltage;
   a first default transistor, comprising:
      a gate configured to receive the second supply voltage;
      a first node configured to receive the first supply voltage; and
      a second node electrically coupled to the gate of the second transistor of the back-gate biased selector circuit and configured to provide the first supply voltage from the first node of the first default transistor in response to the gate of the first default transistor being activated in response to the second supply voltage being unavailable, wherein the gate of the second transistor of the back-gate biased selector circuit deactivates in response to the first supply voltage; and
   a second default transistor, comprising:
      a gate configured to receive the second supply voltage;
      a first node electrically coupled to a ground voltage source; and
      a second node electrically coupled to the gate of the first transistor of the back-gate biased selector circuit and configured to provide a ground voltage from the first node of the second default transistor in response to the gate of the second default transistor being activated in response to the second supply voltage being unavailable, wherein the gate of the first transistor of the back-gate biased selector circuit activates in response to the ground voltage.

2. The automatic voltage switching circuit of claim 1, wherein:
   the first transistor of the back-gate biased selector circuit comprises a first p-type metal-oxide semiconductor (PMOS) transistor, wherein the first node comprises a drain and the second node comprises a source; and the second transistor of the back-gate biased selector circuit comprises a second PMOS transistor, wherein the first node comprises a drain and the second node comprises a source.

3. The automatic voltage switching circuit of claim 2, wherein the voltage level shifter circuit comprises:
a first n-type MOS (NMOS) transistor, comprising:
a source electrically coupled to the ground voltage source;
a gate configured to receive the compare signal; and
a drain; and
a second NMOS transistor, comprising:
a source electrically coupled to the ground voltage source;
a gate configured to receive an inverted compare signal; and
a drain.

4. The automatic voltage switching circuit of claim 3, wherein the voltage level shifter circuit further comprises:
a first PMOS transistor, comprising:
a source configured to receive the output voltage and electrically coupled to a back-gate of the first PMOS transistor of the voltage level shifter circuit;
a gate electrically coupled to the drain of the second NMOS transistor; and
a drain electrically coupled to the drain of the first NMOS transistor; and
a second PMOS transistor, comprising:
a source configured to receive the output voltage and electrically coupled to a back-gate of the second PMOS transistor of the voltage level shifter circuit;
a gate electrically coupled to the drain of the first NMOS transistor; and
a drain electrically coupled to the drain of the second NMOS transistor.

5. The automatic voltage switching circuit of claim 4, configured to provide the first supply voltage as the output voltage in response to the second supply voltage falling below a low threshold.

6. The automatic voltage switching circuit of claim 5, wherein:
the first default transistor further comprises a first PMOS transistor, wherein:
the first node of the first default transistor comprises a source; and
the second node of the first default transistor comprises a drain electrically coupled to the gate of the second PMOS transistor of the back-gate biased selector circuit and the gate of the second PMOS transistor of the voltage level shifter circuit; and
the second default transistor further comprises a second PMOS transistor, wherein:
the first node of the second default transistor comprises a drain; and
the second node of the second default transistor comprises a source electrically coupled to the gate of the first PMOS transistor of the back-gate biased selector circuit and the gate of the first PMOS transistor of the voltage level shifter circuit.

7. The automatic voltage switching circuit of claim 3, wherein the voltage level shifter circuit further comprises:
a first PMOS transistor, comprising:
a source configured to receive the output voltage and electrically coupled to a back-gate of the first PMOS transistor of the voltage level shifter circuit;
a gate electrically coupled to the drain of the second NMOS transistor; and
a drain;
a second PMOS transistor, comprising:
a source configured to receive the output voltage and electrically coupled to a back-gate of the second PMOS transistor of the voltage level shifter circuit;
a gate electrically coupled to the drain of the first NMOS transistor; and
a drain;
a third PMOS transistor, comprising:
a source electrically coupled to the drain of the first PMOS transistor;
a gate configured to receive the compare signal;
a back-gate configured to receive the output voltage; and
a drain electrically coupled to the drain of the first NMOS transistor; and
a fourth PMOS transistor, comprising:
a source electrically coupled to the drain of the second PMOS transistor;
a gate configured to receive an inverted compare signal;
a back-gate configured to receive the output voltage; and
a drain electrically coupled to the drain of the second NMOS transistor.

8. The automatic voltage switching circuit of claim 1, wherein the voltage comparator circuit comprises a differential voltage comparator.

9. The automatic voltage switching circuit of claim 8, wherein the voltage comparator circuit further comprises:
a first p-type metal-oxide semiconductor (PMOS) transistor, comprising:
a source configured to receive the first supply voltage;
a gate configured to receive a first drive current from a first current source; and
a drain electrically coupled to the gate of the first PMOS transistor and the first current source; and
a second PMOS transistor, comprising:
a source configured to receive the second supply voltage;
a gate electrically coupled to the gate of the first PMOS transistor and configured to receive the first drive current from the first current source; and
a drain electrically coupled to a second current source and configured to provide the compare signal.

10. The automatic voltage switching circuit of claim 1, configured to provide the first supply voltage as the output voltage in response to an override signal.

11. The automatic voltage switching circuit of claim 1 integrated into an integrated circuit (IC).

12. The automatic voltage switching circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

13. A power switch system, comprising:
a power switch circuit, comprising:
a first transistor, comprising a gate configured to receive a first enable signal shifted into a voltage domain of an output voltage, a source configured to receive a first supply voltage, and a drain coupled to a powered circuit; and a second transistor, comprising a gate configured to receive a second enable signal shifted into the voltage domain of the output voltage, a source configured to receive a second supply voltage, and a drain coupled to the powered circuit; and an automatic voltage switching circuit, comprising:

a voltage comparator circuit configured to generate a compare signal indicating which of the first supply voltage and the second supply voltage is a higher voltage;

a voltage level shifter circuit configured to generate:
a first select signal based on the compare signal indicating the first supply voltage is the higher voltage of the first supply voltage and the second supply voltage, wherein the first select signal is in a voltage domain of the higher voltage; and
a second select signal based on the compare signal indicating the second supply voltage is the higher voltage of the first supply voltage and the second supply voltage, wherein the second select signal is in the voltage domain of the higher voltage; and a back-gate biased selector circuit, comprising:
a first transistor, comprising a first node configured to receive the first supply voltage, a gate configured to receive the first select signal, a second node configured to provide the output voltage from the first node of the first transistor in response to the gate of the first transistor being activated by the first select signal, and a back-gate configured to receive the output voltage; and
a second transistor, comprising a first node configured to receive the second supply voltage, a gate configured to receive the second select signal, a second node configured to provide the output voltage from the first node of the second transistor in response to the gate of the second transistor being activated by the second select signal, and a back-gate configured to receive the output voltage;

a first default transistor, comprising:
a gate configured to receive the second supply voltage;
a first node configured to receive the first supply voltage; and
a second node electrically coupled to the gate of the second transistor of the back-gate biased selector circuit and configured to provide the first supply voltage from the first node of the first default transistor in response to the gate of the first default transistor being activated in response to the second supply voltage being unavailable, wherein the gate of the second transistor of the back-gate biased selector circuit deactivates in response to the first supply voltage; and a second default transistor, comprising:
a gate configured to receive the second supply voltage;
a first node electrically coupled to a ground voltage source; and
a second node electrically coupled to the gate of the first transistor of the back-gate biased selector circuit and configured to provide a ground voltage from the first node of the second default transistor in response to the gate of the second default transistor being activated in response to the second supply voltage being unavailable, wherein the gate of the first transistor of the back-gate biased selector circuit activates in response to the ground voltage.

14. The power switch system of claim 13, wherein:
the first transistor of the back-gate biased selector circuit comprises a first p-type metal-oxide semiconductor (PMOS) transistor, wherein the first node comprises a drain and the second node comprises a source; and
the second transistor of the back-gate biased selector circuit comprises a second PMOS transistor, wherein the first node comprises a drain and the second node comprises a source.

15. The power switch system of claim 14, wherein the voltage level shifter circuit comprises:
a first n-type MOS (NMOS) transistor, comprising:
a source electrically coupled to the ground voltage source;
a gate configured to receive the compare signal; and
a drain; and
a second NMOS transistor, comprising:
a source electrically coupled to the ground voltage source;
a gate configured to receive an inverted compare signal; and
a drain.

16. The power switch system of claim 15, wherein the voltage level shifter circuit further comprises:
a first PMOS transistor, comprising:
a source configured to receive the output voltage and electrically coupled to a back-gate of the first PMOS transistor of the voltage level shifter circuit;
a gate electrically coupled to the drain of the second NMOS transistor; and
a drain electrically coupled to the drain of the first NMOS transistor; and
a second PMOS transistor, comprising:
a source configured to receive the output voltage and electrically coupled to a back-gate of the second PMOS transistor of the voltage level shifter circuit;
a gate electrically coupled to the drain of the first NMOS transistor; and
a drain electrically coupled to the drain of the second NMOS transistor.

17. The power switch system of claim 16, wherein the automatic voltage switching circuit is configured to provide the first supply voltage as the output voltage in response to the second supply voltage falling below a low threshold.

18. The power switch system of claim 17, wherein:
the first default transistor further comprises a first PMOS transistor, wherein:
the first node of the first default transistor comprises a source; and
the second node of the first default transistor comprises a drain electrically coupled to the gate of the second PMOS transistor of the back-gate biased selector circuit and the gate of the second PMOS transistor of the voltage level shifter circuit; and
the second default transistor further comprises a second PMOS transistor, wherein:
the first node of the second default transistor comprises a drain; and
the second node of the second default transistor comprises a source electrically coupled to the gate of the first PMOS transistor of the back-gate biased selector circuit and the gate of the first PMOS transistor of the voltage level shifter circuit.

19. The power switch system of claim 15, wherein the voltage level shifter circuit further comprises:
a first PMOS transistor, comprising:
a source configured to receive the output voltage and electrically coupled to a back-gate of the first PMOS transistor of the voltage level shifter circuit;
a gate electrically coupled to the drain of the second NMOS transistor; and
a drain;
a second PMOS transistor, comprising:
a source configured to receive the output voltage and electrically coupled to a back-gate of the second PMOS transistor of the voltage level shifter circuit;
a gate electrically coupled to the drain of the first NMOS transistor; and
a drain;
a third PMOS transistor, comprising:
a source electrically coupled to the drain of the first PMOS transistor;
a gate configured to receive the compare signal;
a back-gate configured to receive the output voltage; and
a drain electrically coupled to the drain of the first NMOS transistor; and
a fourth PMOS transistor, comprising:
a source electrically coupled to the drain of the second PMOS transistor;
a gate configured to receive an inverted compare signal;
a back-gate configured to receive the output voltage; and
a drain electrically coupled to the drain of the second NMOS transistor.

20. The power switch system of claim 13, wherein the voltage comparator circuit comprises a differential voltage comparator.

21. The power switch system of claim 20, wherein the voltage comparator circuit further comprises:
a first p-type metal-oxide semiconductor (PMOS) transistor, comprising:
a source configured to receive the first supply voltage;
a gate configured to receive a first drive current from a first current source; and
a drain electrically coupled to the gate of the first PMOS transistor and the first current source; and
a second PMOS transistor, comprising:
a source configured to receive the second supply voltage;
a gate electrically coupled to the gate of the first PMOS transistor and configured to receive the first drive current from the first current source; and
a drain electrically coupled to a second current source and configured to provide the compare signal.

22. The power switch system of claim 13, wherein the automatic voltage switching circuit is configured to provide the first supply voltage as the output voltage in response to an override signal.

23. The power switch system of claim 13 integrated into an integrated circuit (IC).

24. The power switch system of claim 13 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *